(12) United States Patent
Kuisma

(10) Patent No.: US 10,934,157 B2
(45) Date of Patent: Mar. 2, 2021

(54) PACKAGED CIRCUIT SYSTEM STRUCTURE

(71) Applicant: MURATA MANUFACTURING CO., LTD., Nagaokakyo (JP)

(72) Inventor: Heikki Kuisma, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 352 days.

(21) Appl. No.: 16/085,661

(22) PCT Filed: Mar. 15, 2017

(86) PCT No.: PCT/IB2017/000249
§ 371 (c)(1),
(2) Date: Sep. 17, 2018

(87) PCT Pub. No.: WO2017/163116
PCT Pub. Date: Sep. 28, 2017

(65) Prior Publication Data
US 2020/0290866 A1    Sep. 17, 2020

(30) Foreign Application Priority Data

Mar. 21, 2016    (FI) .................................... 20165229

(51) Int. Cl.
*B81B 7/00*    (2006.01)
*H01L 23/00*    (2006.01)
*B81C 1/00*    (2006.01)

(52) U.S. Cl.
CPC ........ *B81B 7/0064* (2013.01); *B81C 1/00261* (2013.01); *H01L 24/20* (2013.01);
(Continued)

(58) Field of Classification Search
CPC ..... B81B 7/0064; H01L 24/20; H01L 23/552; H01L 23/06582; H01L 2225/06586;
(Continued)

(56) References Cited

U.S. PATENT DOCUMENTS

2002/0153582 A1    10/2002    Takehara et al.
2007/0138614 A1    6/2007    Harrison et al.
(Continued)

FOREIGN PATENT DOCUMENTS

JP    2005109306 A    4/2005
JP    2012074607 A    4/2012
(Continued)

OTHER PUBLICATIONS

International Preliminary Report on Patentability dated Jul. 5, 2018 corresponding to International Patent Application No. PCT/IB2017/000249.
(Continued)

*Primary Examiner* — Feifei Yeung Lopez
(74) *Attorney, Agent, or Firm* — Squire Patton Boggs (US) LLP

(57) ABSTRACT

A packaged circuit system structure with circuit elements embedded into a bulk material. At least one of the embedded circuit elements forms a dual coupling that includes an electrical connection to a signal ground potential on one side of the structure and an electrical connection to a conductive layer on the other side of the structure. The conductive layer extends over at least one embedded circuit element that does not form a dual coupling, and thereby provides an effective EMI shielding for it.

8 Claims, 8 Drawing Sheets

(52) U.S. Cl.
CPC ......... *H01L 2225/0652* (2013.01); *H01L 2225/06517* (2013.01); *H01L 2225/06537* (2013.01); *H01L 2225/06582* (2013.01); *H01L 2225/06586* (2013.01)

(58) Field of Classification Search
CPC ... H01L 2225/06517; H01L 2225/0652; H01L 2225/06537; B81C 1/00261
See application file for complete search history.

(56) References Cited

U.S. PATENT DOCUMENTS

| | | | |
|---|---|---|---|
| 2008/0019112 A1 | 1/2008 | Hatanaka et al. | |
| 2009/0000114 A1 | 1/2009 | Rao et al. | |
| 2009/0302439 A1 | 12/2009 | Pagaila et al. | |
| 2014/0239464 A1 | 8/2014 | Chung et al. | |
| 2015/0145149 A1 | 5/2015 | Wachter et al. | |
| 2015/0194388 A1 | 7/2015 | Pabst et al. | |
| 2015/0332938 A1 | 11/2015 | Palm et al. | |
| 2015/0348936 A1 | 12/2015 | Lin et al. | |
| 2017/0057808 A1* | 3/2017 | Chang | B81B 7/007 |

FOREIGN PATENT DOCUMENTS

| | | |
|---|---|---|
| KR | 20120039338 A | 4/2012 |
| WO | 2009122835 A1 | 10/2009 |
| WO | WO 2010/041356 A1 | 4/2010 |

OTHER PUBLICATIONS

International Search Report and Written Opinion dated Dec. 14, 2017 corresponding to International Patent Application No. PCT/IB2017/000249.

Finnish Search Report dated Nov. 3, 2016 corresponding to Finnish Patent Application No. 20165229.

Chang-Lee Chen et al., "Bond Wireless Multichip Packaging Technology for High-Speed Circuits," IEEE Transactions on Component Parts, IEEE, vol. 15, No. 14, Aug. 15, 1992, pp. 451-456, XP000311384.

* cited by examiner

PACKAGED CIRCUIT SYSTEM STRUCTURE

FIELD OF THE DISCLOSURE

The present disclosure relates to circuit systems, and particularly to packaged circuit systems that include two or more circuit elements. The present disclosure further concerns a method for manufacturing a packaged circuit system that includes two or more circuit elements.

BACKGROUND OF THE DISCLOSURE

Electromagnetic (EM) field is defined as a property of space caused by the motion of an electric charge (Encyclopedia Britannica). A stationary charge generates an electric field in the surrounding space, and when the charge is moving, a magnetic field is also produced. An electric field can be produced also by a changing magnetic field. The mutual interaction of electric and magnetic fields produces an electromagnetic field.

Both man-made and natural sources of EM fields in the space tend to disturb operation of electrical devices. For example, sensors used in automotive systems are exposed to various changing fields, and need to be effectively shielded to avoid electromagnetic interference (EMI). Normally the devices are isolated by blocking EM fields with barriers made of conductive or magnetic materials. For example, a conventional microelectromechanical system (MEMS) device typically includes a MEMS die and an integrated circuit (IC) die, and the required shielding has been achieved by having a layer of metal on each side of the assembled MEMS and IC dies. In pre-molded plastic packages, shielding is often achieved by having a lead frame (die pad) on one side of the assembly and a grounded lid on the other side of the assembly. Over-molded plastic packages mainly use a so-called inverted die-pad, where the shield is provided by the die-pad on one side, and by a metallization on the printed wiring board (PWB) on the other side.

In recent years, also many leadless package technologies have been developed to streamline manufacturing processes and to reduce the size of the packages. However, the established leadless package technologies do not yet provide appropriate solutions for EMI shielding in challenging conditions, which are typical in automotive applications.

BRIEF DESCRIPTION OF THE DISCLOSURE

An object of the present disclosure is to introduce a packaged circuit system structure, in which effective EMI shielding for embedded circuit elements is provided in a simple manner.

The objects of the disclosure are achieved by a packaged circuit system structure and a manufacturing method, which are characterized by what is stated in the independent claims. The preferred embodiments of the disclosure are disclosed in the dependent claims.

In the solution, a side normally exposed to external EM fields is at least partially covered with a conductive layer, and one of the embedded circuit elements is arranged to form a dual coupling through an embedding bulk material, and thereby couple the conductive layer and a signal ground potential. The conductive layer in the signal ground potential thus provides an effective EMI shielding to circuit elements covered by it. The improved EMI shielding can be implemented with simple structural elements in an easily manufactured manner.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture with which various embodiments of the invention may be implemented. Only elements relevant for illustrating the embodiments are described in detail. Various components of integrated devices, which are generally known to a person skilled in the art, may not be specifically described herein.

Figure 1:
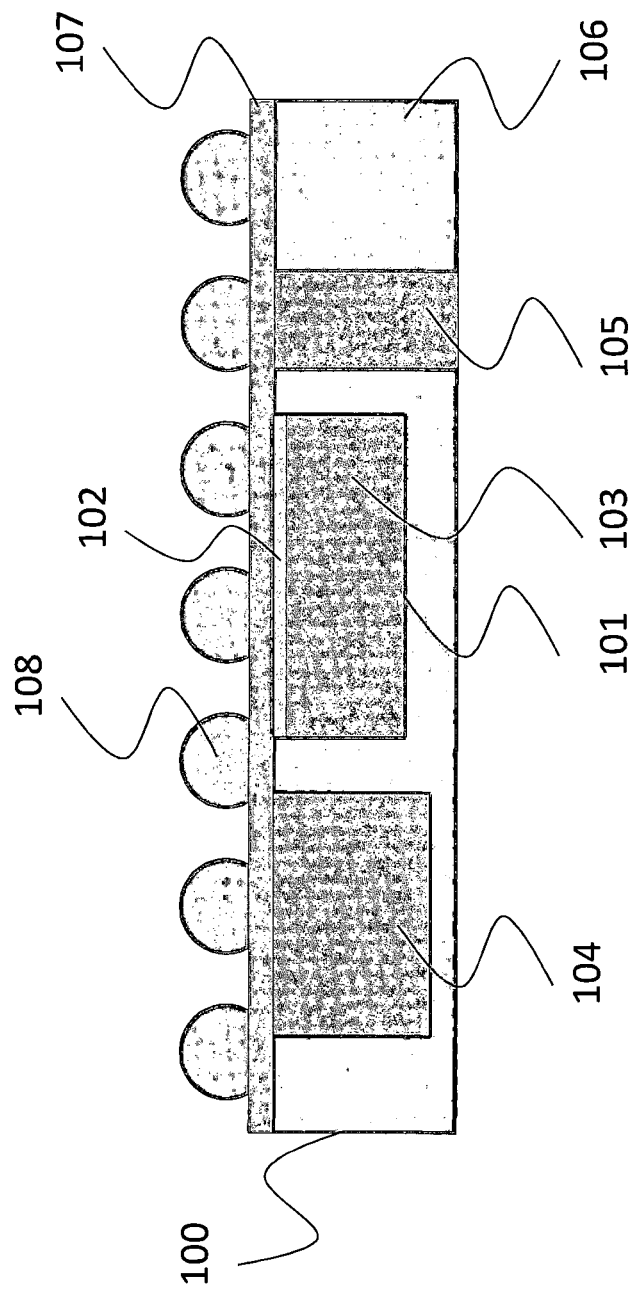
FIG. 1 illustrates a typical state of the art packaged circuit system structure.

The schematic of FIG. 1 illustrates a typical state of the art packaged circuit system structure. The structure includes one or more circuit element (dies) of possibly different origin (different wafers, designs, technologies). FIG. 1 shows an exemplary fan-out wafer level packaging (FO-WLP) device, an integrated device 100 that can be formed by embedding circuit elements into a bulk material. The circuit elements may include one or more IC dies 101, one or more other elements 104 and one or more conductive via—forming parts 105, embedded in a low cost plastic material 106. The other elements 104 may include, for example, MEMS dies or passive components, like optical elements, or any other electrical components or subassemblies.

The IC die 101 typically includes a substrate part 103 and a surface part 102 with circuit features and contact pads of the IC die. The surface part 102 of the IC die 101 and contact surfaces of the other embedded elements 104 are oriented similarly to be on, or aligned to one surface of the integrated device 100. This one surface may be covered by a combination of insulator and conductor layers that form a redistribution layer (RDL) 107. The RDL is configured to provide selectively connections to elements that are in contact with conductive parts of the RDL. External connection elements, like solder bumps 108 are typically fabricated on top of the RDL, into positions that also enable contact with the conductive parts of the RDL. The RDL thus provides selectively connections between circuit elements of the element layer and the external connection elements 108 of the integrated device 100. The back sides of the dies may either be embedded in the plastic (as the other element 104 and the IC die 101) or may extend to alignment with the back surface of the integrated device (as the conductive via-forming part 105). As fan-out wafer level packaging (FO-WLP) devices are diced from a larger entity, their vertical sides are of the low cost plastic material 106, and therefore do not include any functional structures, like conducting leads.

Figure 2:
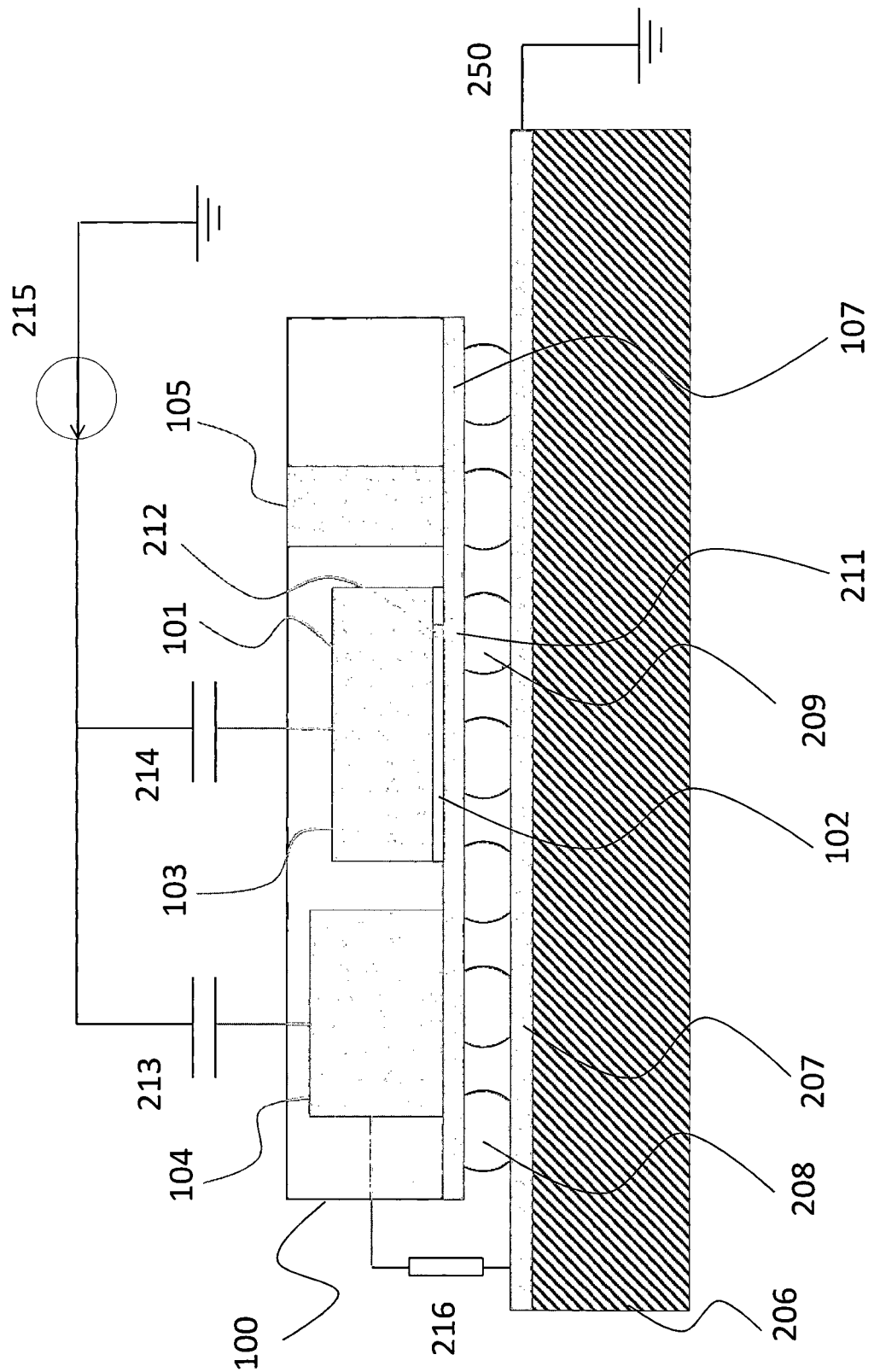
FIG. 2 shows the structure of FIG. 1 in a soldering assembly to a printed wiring board.

FIG. 2 shows the integrated FO-WLP device 100 of FIG. 1 in a soldering assembly to a printed wiring board (PWB) 206. The effect of varying external electric fields to the integrated device is illustrated by an AC voltage source 215. Capacitive coupling of the virtual voltage source 215 to each of the embedded dies 104, 101 is illustrated by capacitances 213 and 214, respectively. The substrate part 103 of the IC die 101 is usually connected to a potential that represents ground potential to signals of the integrated device. In FIG. 2, the surface part 102 of the IC die 101 is shown to include a contact pad 212 that is in electrical contact with the substrate part 103. This contact pad 212 is aligned with a contact area and wiring 211, which is part of the RDL 107. The contact area and wiring 211 is connected to a signal ground 250 or equivalent potential on the PWB 206. The redistribution layer RDL 107 thus provides an electrical connection to the signal ground potential 250.

In this configuration, the substrate 103 of the IC die 101 forms a natural EMI shield for the circuit part 102 of the IC die. However, the other circuit elements 104, like the MEMS dies, passive devices, and/or electrical subassemblies do not have such a natural shield. The bulk volume of the embedded dies may be connected to a relatively high impedance 216 (for example, via the RDL 107 of the integrated device 100, the circuit part 103 of the IC die 101, the solder bumps 209 and the PWB 206, or via the RDL 107 of the integrated device 100, the solder bumps 208, PWB 206 and external impedances connected to the PWB). In such a case, a fraction of the voltage of the voltage source 215 appears between a circuit element and the signal ground. The magnitude of said voltage fraction depends on a voltage division by the capacitance 213 and the impedance 216. This voltage fraction may sometimes be high enough to detrimentally affect the operation of the integrated device due to EMI.

Figure 3:
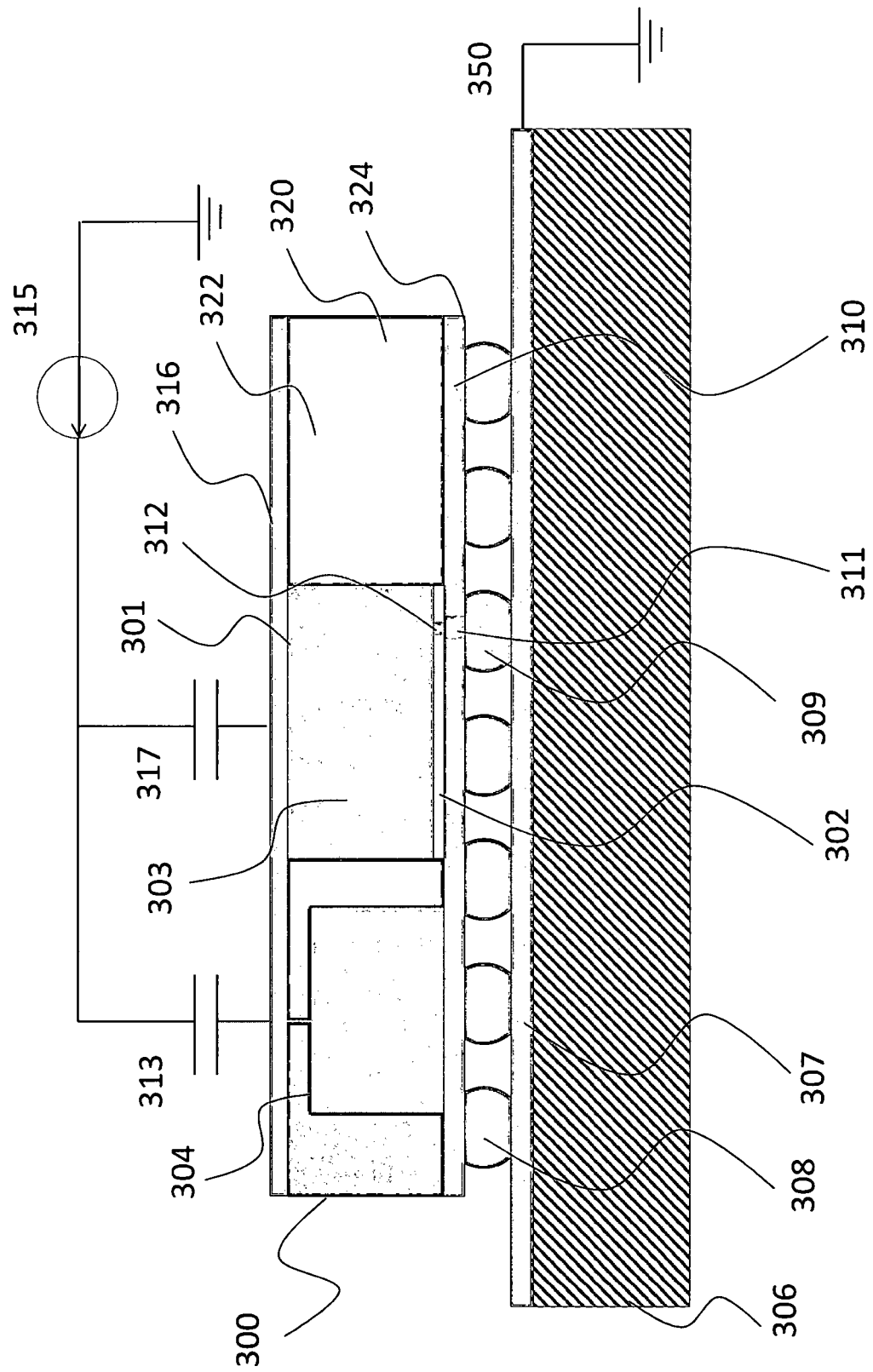
FIG. 3 illustrates an embodiment of an improved packaged circuit system structure.

FIG. 3 illustrates an embodiment of a packaged circuit system structure that provides an improved EMI shielding to the embedded circuit elements and helps to avoid the described EMI effect. The packaged circuit system structure is hereinafter referred to as the integrated device 300. The effect of varying external electric fields to the integrated device is again illustrated by a voltage source 315. Capacitive coupling of the virtual voltage source 315 to each of the embedded dies 304, 301 is further illustrated by capacitances 313 and 317, respectively. The integrated device 300 includes a circuit layer 320 in which circuit elements 301, 304 are embedded into a bulk material 322. The integrated device 300 includes also external connection elements 308, 309, and a redistribution layer 310 configured to provide selectively connections between the circuit elements 301, 304 of the element layer and the external connection elements 308, 309, as described above. Let us denote that the packaged circuit system structure has a first side 324 that includes the external connection elements 308, 309. The integrated device 300 includes also a conductive layer 316, which is on a second side of integrated device. The second side is the side opposite to the first side of the integrated device. The conductive layer 316 at least partially covers the surface of the second side. In the example of FIG. 3, the conductive layer covers the whole surface of the second side. In case of FO-WLP devices, the sides of the integrated device 300 between the first side 324 and the second side are of the bulk material 322. In other words, the outer surface of the integrated device 300 between the first surface and the second surface does not include conductive parts to create a conductive path between the conductive layer and the redistribution layer.

At least one of the embedded circuit elements is now arranged to form a dual coupling through the bulk material. The dual coupling is formed of an electrical connection to a signal ground potential 350, and an electrical connection to the conductive layer 316 of the integrated device 300. In the exemplary embodiment of FIG. 3, an IC die 301 is arranged to extend from the redistribution layer 310 of the integrated device 300 to the conductive layer 316 on the second side of the integrated device 300. The IC die 301 includes a substrate part 303 and a surface part 302. The substrate part 303 of the IC die is aligned to a surface of the circuit layer 320, which surface is oriented towards the second side, and is thus exposed to and in contact with the conductive layer 316. The surface part 302 of the IC die is aligned to form part of a surface of the circuit layer 320, which surface is oriented towards the first side 324. The IC die is thus exposed to and in contact with one or more conductive parts of the redistribution layer 310. The conductive part of the redistribution layer 310 includes a contact area and wiring 311 to the signal ground potential 350. The surface part 302 of the IC die 301 is again shown to include a contact pad 312 that is in electrical contact with the substrate part 303 of the IC die. As described with FIG. 2, this contact pad 312 is aligned with the contact area and wiring 311 of the redistribution layer 307 and is thereby connected to a signal ground 350 or equivalent potential on a printed wiring board 306. Due to the low impedance contact between the conductive layer 316 and the substrate part 303, the voltage of the conductive layer 316 is thus negligible and the conductive layer 316 remains practically at the signal ground potential.

The conductive layer 316 extends over the embedded circuit element it is in contact with for the dual coupling, here over the IC die 301. In addition, the conductive layer 316 extends also over at least one embedded circuit element that does not form the dual coupling, here a MEMS die 304. The expression extend over in this context means that the conductive layer 316 forms a conductive layer between the embedded circuit element and the external EM fields. In FIG. 3, the layers 316, 320, 310 of the integrated device 300 extend in a horizontal direction and the conductive layer 316 extends horizontally over the MEMS die 304 and thereby effectively shields it from the influence of the voltage source 315, i.e. from the external EM fields and thus renders the capacitance 313 from the effective voltage source 315 to the MEMS die 304 close to zero, depending on the degree of extension of the coverage of the layer 316 over the die 304

The conductive layer 316 layer may be of any conductive material. Advantageously, the conductive layer is a metal layer, formed of one metal material, or of multiple sub-layers of metal materials. An example of an advantageous sub-layered configuration includes a double layer structure that includes a layer of titanium (Ti) or titanium-tungsten (Ti/W) in combination with a layer of copper (Cu) or aluminum (Al). This conductive layer 316 is in immediate contact with the substrate part 303. The electrical connection in the dual coupling may be an ohmic contact between the metal material of the conductive layer 316 and the silicon material of the substrate part 303. Also a Schottky-barrier type contact between the metal material of the conductive layer 316 and the silicon material of the substrate part 303 may be applied. The Schottky-barrier type contact is adequate for the purpose since the interface capacitance of the Schottky-barrier will be many orders of magnitude higher than the capacitance 317 from the voltage source 315 to the conductive layer 316 and will present a low impedance contact at a high frequency.

Figure 4:
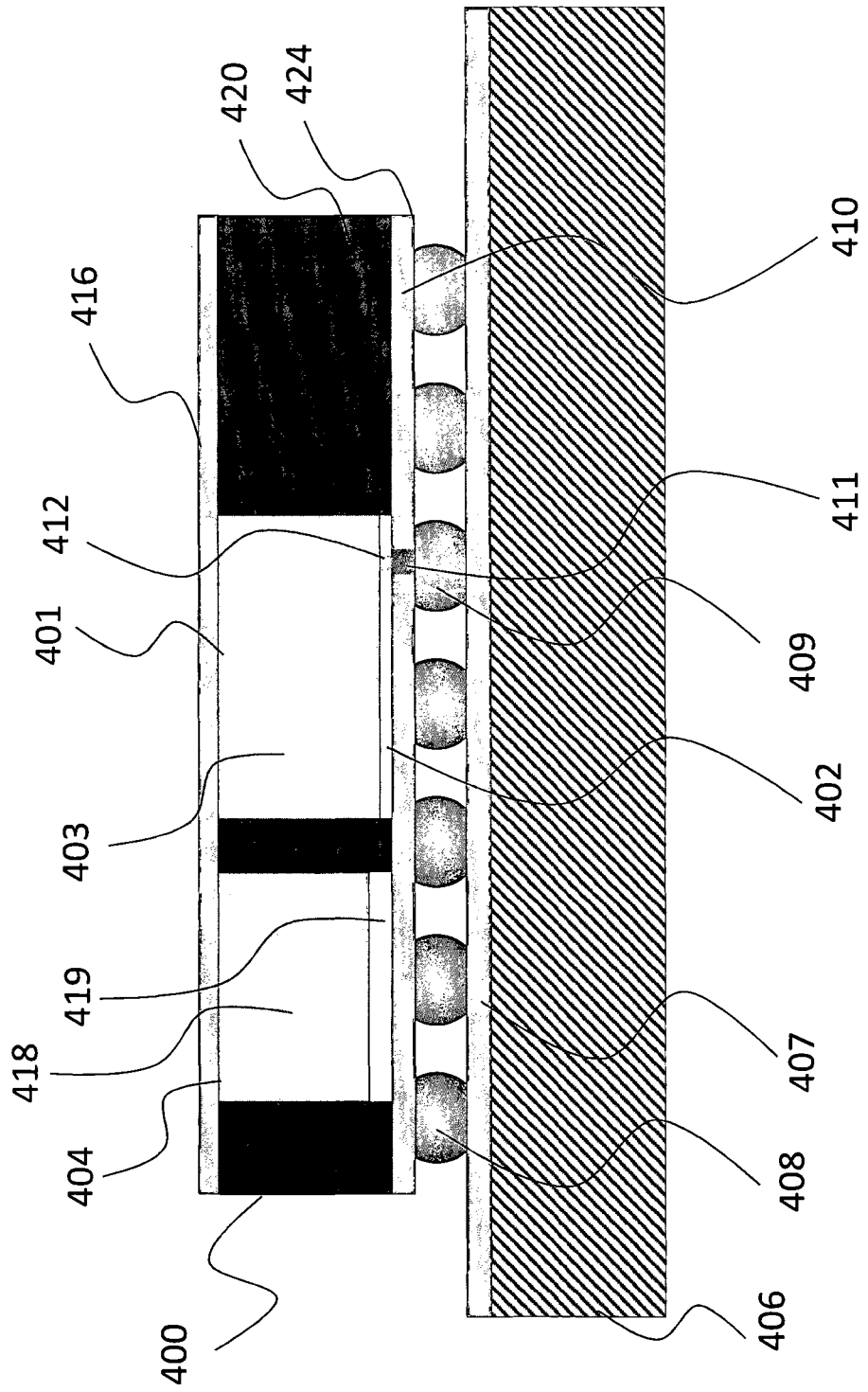
FIG. 4 illustrates another embodiment of a packaged circuit system structure.

Let us denote that a vertical dimension of the embedded circuit element that forms the dual coupling is the dimension perpendicular to the first surface and the second surface. At least part of the vertical dimension of the embedded circuit element 301 that forms the dual coupling is not of conductive material. The term conductive material refers herein to materials, the resistivity of which is in the order of $10^{-8}$ to $10^{-7}$ Ohmm. In case of circuit elements that include a substrate part and a surface part, the part of the vertical dimension of the embedded circuit element includes the substrate part. In case of a circuit element with uniform structure, like a semiconductor via, the part of the vertical dimension of the embedded circuit element includes the whole vertical extent of the via. The requirement relates to properties of the connection path from the conductive layer 316 to the signal ground 350, as will be discussed in more detail with FIGS. 7 and 8. FIG. 4 illustrates a further embodiment of a packaged circuit system structure, hereinafter referred to as the integrated device 400. The elements of FIG. 4 by far correspond to the elements of the FIG. 3, so more detailed description on them may be referred from description of FIG. 3. The integrated device 400 includes a circuit layer 420 in which circuit elements 401, 404 are embedded into a bulk material. The integrated device 400 includes also external connection elements 408, 409, and a redistribution layer 410 configured to provide selectively connections between the circuit elements 401, 404 of the element layer and the external connection elements 408, 409, as described above. A first side 424 if the integrated device includes external connection elements 408, 409. A conductive layer 416 is on a second side, opposite to the first side of the integrated device.

The integrated device 400 includes an IC die 401 and a MEMS die 404. The IC die includes a substrate part 403 and a surface part 402 and forms a dual coupling, as described with the IC die of FIG. 3. The MEMS die includes a device layer 419 and a substrate part 418. In this embodiment, also the substrate part 418 of the MEMS die is aligned to form a surface of the circuit layer 420 and is thus exposed to and in contact with the conductive layer 416. This will force the substrate part 418 of the MEMS die to the same near ground potential as the conductive layer 416. This is allowed and even advantageous whenever the MEMS device has a layered structure in which a device layer 419 is on the front surface of the MEMS die, i.e. in the first side of the integrated device, and the device layer 419 is electrically isolated from the substrate part 418. A MEMS device fabricated on a silicon on insulator (SOI) wafer has this kind of a structure by default. The conductive layer 416 and the substrate part 403 provide an effective EMI shielding to the device layer.

Figure 5:
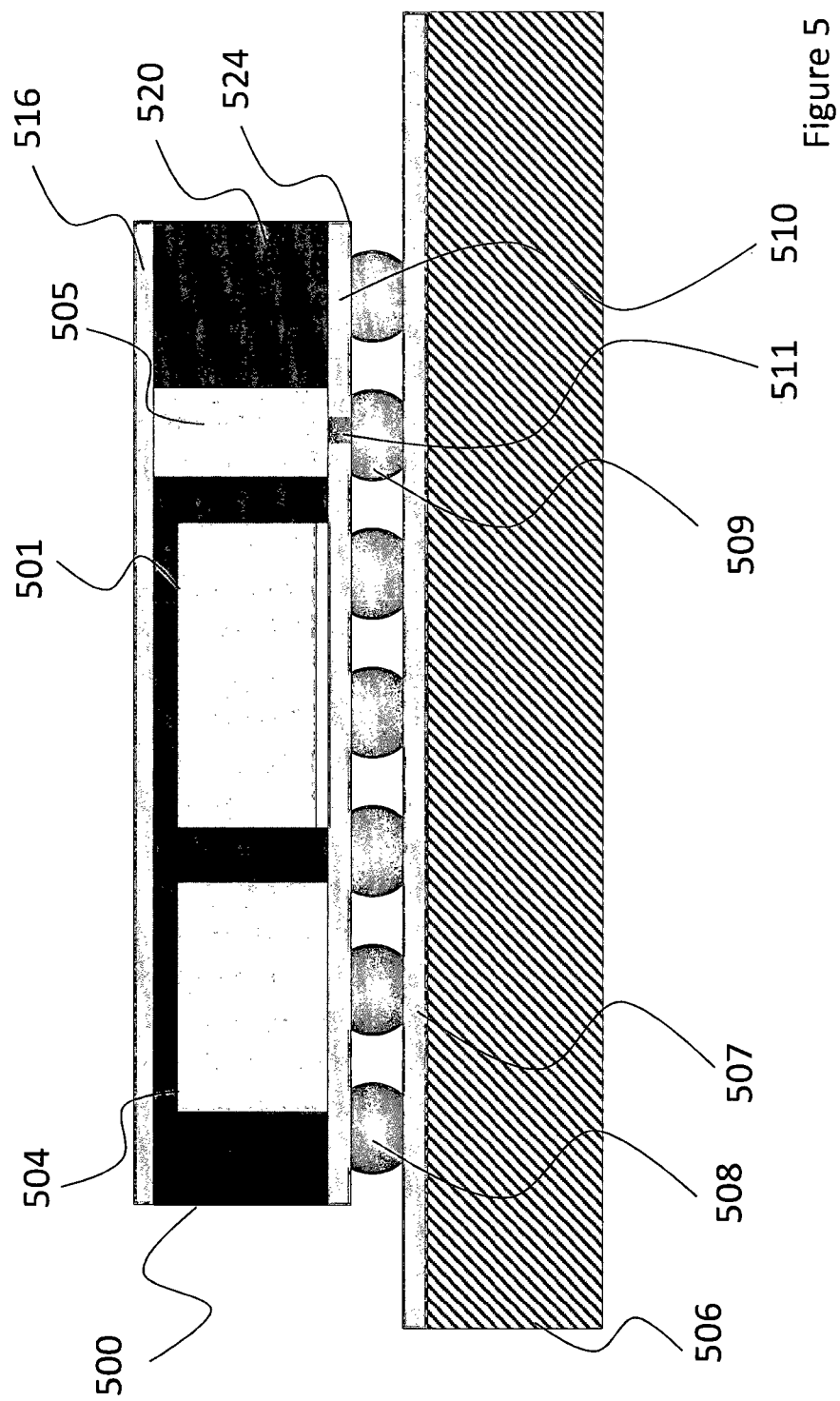
FIG. 5 illustrates a further embodiment of a packaged circuit system structure.

FIG. 5 illustrates a further embodiment of a packaged circuit system structure, hereinafter referred to as the integrated device 500. The elements of FIG. 5 by far correspond to the elements of the FIG. 3, so more detailed description on them may be referred from description of FIG. 3. The integrated device 500 includes a circuit layer 520 in which circuit elements 501, 504 are embedded in a bulk material. The integrated device 500 includes also external connection elements 508, 509, and a redistribution layer 510 configured to provide selectively connections between the circuit elements 501, 504 of the element layer and the external connection elements 508, 509, as described above. A first side 524 if the integrated device includes external connection elements 508, 509. A conductive layer 516 is on a second side, opposite to the first side 524 of the integrated device.

The integrated device 500 includes an IC die 501 and a MEMS die 504. The integrated device 500 includes also a via of semiconductor material forming part 505, hereinafter referred to as a conductive via 505. In this embodiment, the via 505 forms the dual coupling by means of an electrical connection to a signal ground potential, and an electrical connection to the conductive layer of the integrated device 500. In the embodiment of FIG. 5, the via 505 is arranged to extend from the redistribution layer 510 to the conductive layer 516 of the integrated device 500. One end of the via 505 is aligned to form a surface of the circuit layer 520 and is thus exposed to and in contact with the conductive layer 516. The other end of the via 505 is aligned to an opposite surface of the circuit layer 520 and is thus exposed to and in contact with the redistribution layer 510 that includes a contact area and wiring 511 to the signal ground potential. The conductive layer 516 extends horizontally over the IC die 501 and the MEMS die 504 and provides effective EMI shielding for them.

Figure 6:
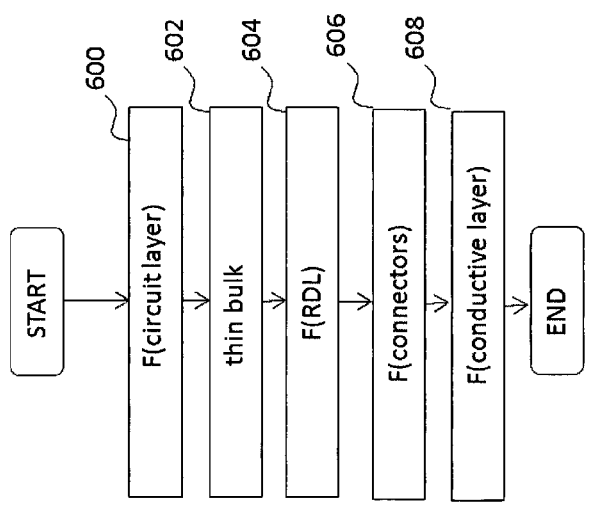
FIG. 6 illustrates stages of a method for manufacturing the improved packaged circuit system structure.

The flow chart of FIG. 6 illustrates stages of a method for manufacturing the packaged circuit system structure shown in FIGS. 3 to 5. The process may start by fabricating (stage 600) a circuit layer wafer that includes one or more circuit elements of possibly different origin (different wafers, designs, technologies), embedded into a bulk material.

For example, fan-out wafer level packaging (FO-WLP) process, well known to a person skilled in the art may be applied. The bulk material may be thinned (stage 602) from one surface of the circuit layer wafer such that at least one of the embedded circuit elements is exposed. A redistribution layer that includes an electrical connection to a signal ground potential is fabricated (stage 604) on a surface of the circuit layer that is not thinned, and external connection elements are fabricated (stage 606) on the redistribution layer. The redistribution layer thus provides selectively connections between circuit elements of the element layer and the external connection elements. A conductive layer is fabricated (stage 608) on the thinned surface. The exposed embedded circuit element thus forms a dual coupling that includes an electrical connection to the signal ground potential, and an electrical connection to the conductive layer. The conductive layer is made to extend over at least one embedded circuit element that does not form a dual coupling.

FIGS. 3, 4 and 5 show embodiments where the conductive layer is added on top of a FO-WLP packaged device and this shielding conductive layer is connected to the signal ground potential of a printed wiring board via one of the embedded structures within the device, via the redistribution layer on the first surface of the device, and via external connection elements, like solder spheres.

A common understanding is that the resistance of the connection between the conductive layer and the ground plane on the printed wiring board should be made as small as possible. This is true up to a certain frequency, but it has now been detected that there exists a frequency range where the contrary is true: the lower the resistance the poorer is the shielding effect.

Figure 7:
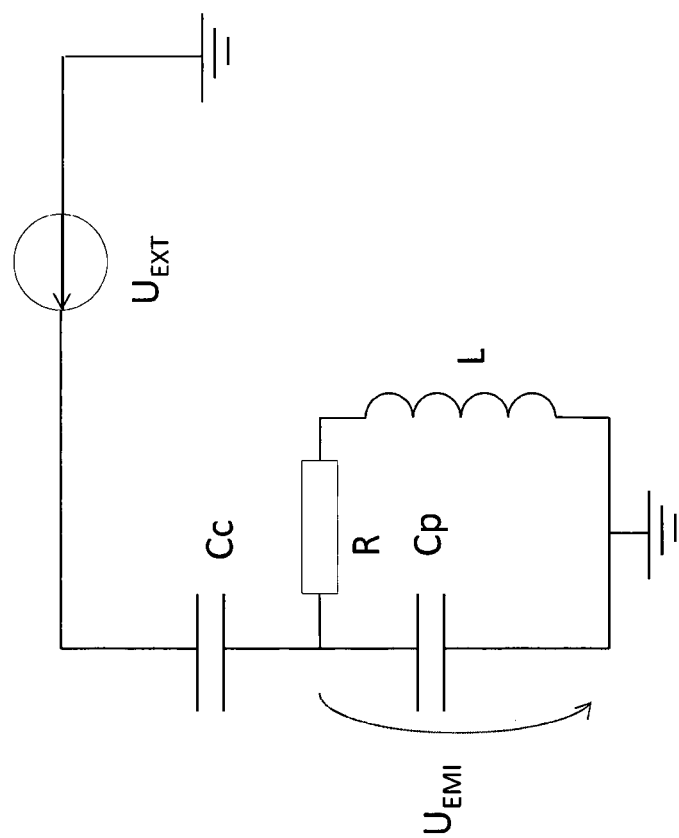
FIG. 7 shows a scheme of a circuit formed by a connection path within the packaged circuit system structure.

It can be seen from FIGS. 3, 4 and 5 that the conductive layer and any ground potential plane on the printed wiring board form a capacitor, with parts of the FOWLP-device being located within the capacitor. Accordingly, in the connection path from the conductive layer to the ground potential plane there is, in addition to resistance, also an inductive component, produced especially by any narrow and long wiring section. FIG. 7 shows a scheme of a circuit hereby formed, and the associated capacitive coupling of EMI.

Figure 8:
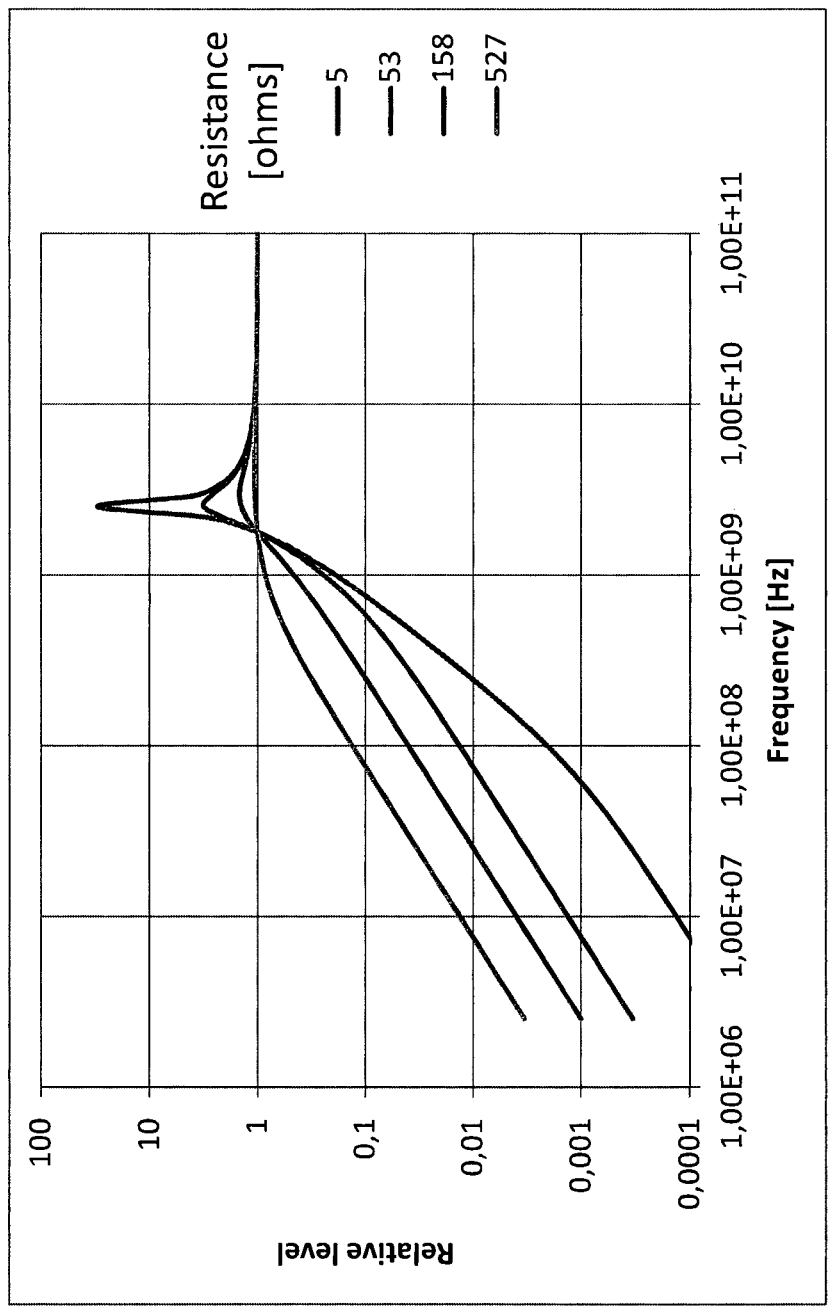
FIG. 8 shows curves illustrating the effect of resistance in the connection path.

The circuit of the FIG. 7 can be analyzed, and the disturbing voltage $U_{EMI}$ solved:

$$U_{EMI} = \frac{j\omega RC_c\left(1 + j\omega \frac{L}{R}\right)}{1 + j\omega RC_p + (j\omega)^2 LC_p} U_{EXT} \quad (1)$$

Where $C_P$ is the coupling capacitance from an external disturbing source, $U_{EXT}$ is the voltage of the external source, R is the resistance of the connection path, L is the inductance of the connection path, $C_P$ is the package capacitance and ω is the angular frequency of the disturbing voltage. In microelectromechanical devices, typical exemplary values for package capacitance and inductance of the connection path would be in the order of $C_P$=0.4 pF and L=10 nH. FIG. 8 shows the absolute value of the ratio $(U_{EMI}C_P)/(U_{EXT}C_C)$ plotted as a function of frequency for different values of R. This ratio is not the total attenuation but just the relative value with respect to very high frequencies, where the capacitive voltage division dominates.

The curves of FIG. 8 show, that at small values of R, like R=5, there is a marked resonance at about 2.5 GHz. in practice, such resonance is very detrimental since this band is commonly used by many communication systems like WiFi. At higher values of the resistance R, e.g. in the range from 50 to 150 ohms, this resonance becomes negligible, but then at the expense of higher signal levels at lower frequencies. But overall, the higher resistances produce much more acceptable results. The exact optimum values vary based on dimensions of the package, and no generally valid resistance values can be defined. The optimum value for the resistance of the connection path may vary between 20 ohms and 1 kohm.

The shielding arrangement shown in FIGS. 3, 4 and 5 offer a novel way to include the resistance R in the conductive path. Since the substrate part 303/403 of the IC die in FIG. 3/4 has most often high resistivity and the substrate contact has a limited size the resulting resistance can be easily brought to the desired range. If the resistance is dominated by the spreading resistance of one contact of finite size it will be $$R_{SPRD} = \frac{\rho}{2d} \quad (2)$$

Where ρ is the resistivity of silicon and d is the diameter of the contact point. If ρ=5 ohmcm and d=100 μm then $R_{SPRD}$=250 ohm, which is a very usable value for preventing the resonance of FIG. 8. This same principle can be applied to the conductive via 505 of FIG. 5. The conductive via may be made of semiconductor material, for example of silicon with resistivity and contact size selected to produce the desired resistance value according to equation 2.

It is apparent to a person skilled in the art that the order of some stages of the process may be varied, depending on the applied technologies. The intermediate step of thinning the surface of the circuit layer wafer provides an easy way to expose one or more of the embedded circuit elements to be connected to the ground potential from the side of their substrate part.

As technology advances, the basic idea of the invention can be implemented in various ways. The invention and its embodiments are therefore not restricted to the above examples, but they may vary within the scope of the claims.

The invention claimed is:

1. A packaged circuit system structure, including
a circuit layer including circuit elements embedded into a bulk material, vertical sides of the circuit layer being of the bulk material;
external connection elements;
a redistribution layer configured to provide selectively connections between circuit elements of the circuit layer and the external connection elements; wherein
the packaged circuit system structure has a first side that includes the external connection elements;
the redistribution layer provides an electrical connection to a signal ground potential;
the packaged circuit system structure includes a conductive layer on a second side of the packaged circuit system structure, wherein the second side is opposite to the first side;
at least one of the embedded circuit elements is an embedded integrated circuit die;
the embedded integrated circuit die includes a substrate part and a surface part;
the substrate part of the embedded integrated circuit die is aligned to a surface of the circuit layer, which surface is oriented towards the second side, and is thus exposed to and in electrical contact with the conductive layer;
the surface part of the embedded integrated circuit die includes a contact pad that is in electrical contact with the substrate part of the integrated circuit die and the redistribution layer, whereby
the embedded integrated circuit die forms a dual coupling that includes an electrical connection to the signal ground potential, and an electrical connection to the conductive layer;
at least one of the embedded elements is a microelectromechanical system die that does not form the dual coupling;
the conductive layer extends on the second side over the embedded microelectromechanical die that does not form the dual coupling.

2. A packaged circuit system structure according to claim 1, wherein the conductive layer is a metal layer.

3. A packaged circuit system structure according to claim 2, wherein the metal layer includes sub-layers of different metals.

4. A packaged circuit system structure according to claim 1, wherein the electrical connection is an ohmic contact or a Schottky barrier contact.

5. A packaged circuit system structure according to claim 1, wherein the signal ground potential is the ground potential for all signals of the packaged circuit system structure.

6. A packaged circuit system structure according to claim 1, wherein:
a vertical dimension of the embedded integrated circuit die that forms the dual coupling is the dimension perpendicular to the first surface and the second surface;
at least part of the vertical dimension of the embedded integrated circuit die that forms the dual coupling is of material that is not conductive material.

7. A packaged circuit system structure according to claim 1, wherein outer surface of the packaged circuit system structure between the first surface and the second surface does not include conductive parts to create a conductive path between the conductive layer and the redistribution layer.

8. A method of manufacturing a packaged circuit system structure, the method including:
- fabricating a circuit layer including circuit elements embedded into a bulk material such that vertical sides of the circuit layer are of the bulk material;
- fabricating on the circuit layer a redistribution layer that provides an electrical connection to a signal ground potential;
- fabricating on the redistribution layer external connection elements, the redistribution layer providing selectively connections between circuit elements of the circuit layer and the external connection elements, and a side including the connection elements being a first side of the packaged circuit system structure;
- including in the packaged circuit system structure an integrated circuit die and a microelectromechanical system die, the embedded integrated circuit die including a substrate part and a surface part, a contact pad that is in electrical contact with the substrate part of the integrated circuit die and the redistribution layer;
- thinning the bulk material from a second side that is opposite to the first side such that the substrate part of the embedded integrated circuit die becomes aligned to a surface of the circuit layer, and the substrate part of the embedded integrated circuit die is exposed;
- fabricating a conductive layer on the thinned second side of the packaged circuit system structure such that the integrated circuit die forms a dual coupling that includes an electrical connection to the signal ground potential, and an electrical connection to the conductive layer;
- extending the conductive layer over microelectromechanical system die that does not form a dual coupling.

\* \* \* \* \*